United States Patent
Kim et al.

(10) Patent No.: US 8,575,991 B2
(45) Date of Patent: Nov. 5, 2013

(54) SWITCHING CIRCUIT SHARING A RESISTOR FOR SWITCHING DEVICES

(75) Inventors: Yu Sin Kim, Gyeonggi-do (KR); Sung Hwan Park, Gyeonggi-do (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 13/480,374

(22) Filed: May 24, 2012

(65) Prior Publication Data

US 2013/0015902 A1    Jan. 17, 2013

(30) Foreign Application Priority Data

Jul. 13, 2011    (KR) .................. 10-2011-0069528

(51) Int. Cl.
*H03K 17/687*    (2006.01)
(52) U.S. Cl.
USPC ............ 327/427; 327/434; 327/436; 333/103
(58) Field of Classification Search
USPC ................... 327/427, 434, 436; 333/101–103
See application file for complete search history.

(56) References Cited

U.S. PATENT DOCUMENTS

| | | | |
|---|---|---|---|
| 6,094,088 A * | 7/2000 | Yano | 327/534 |
| 6,870,241 B2 * | 3/2005 | Nakatani et al. | 257/531 |
| 8,058,922 B2 * | 11/2011 | Cassia | 327/534 |

FOREIGN PATENT DOCUMENTS

| | | |
|---|---|---|
| JP | 10-209835 | 8/1998 |
| JP | 10-761945 | 9/1998 |
| JP | 2005072671 A | 3/2005 |
| JP | 2007-110460 | 4/2007 |

* cited by examiner

*Primary Examiner* — Kenneth B. Wells
(74) *Attorney, Agent, or Firm* — Blakely Sokoloff Taylor & Zafman

(57) ABSTRACT

Disclosed herein is a resistor-sharing switching circuit including: a first switching device and a second switching device; and a resistor whose first end is connected to a control signal input end to which a control signal for controlling bodies of the first switching device and the second switching device is applied and whose second end is connected to the bodies of the first switching device and the second switching device.

4 Claims, 3 Drawing Sheets

- PRIOR ART -

SWITCHING CIRCUIT SHARING A RESISTOR FOR SWITCHING DEVICES

CROSS REFERENCE(S) TO RELATED APPLICATIONS

This application claims the benefit under 35 U.S.C. Section 119 of Korean Patent Application Serial No. 10-2011-0069528, entitled "Resistor-Sharing Switching Circuit" filed on Jul. 13, 2011, which is hereby incorporated by reference in its entirety into this application.

BACKGROUND OF THE INVENTION

1. Technical Field

The present invention relates to a resistor-sharing switching circuit.

2. Description of the Related Art

FIG. 1 is circuit diagram of a general radio frequency (RE) switching circuit.

Referring to FIG. 1, a switching device is provided between a transmission end and an antenna and between a reception end and the antenna to alternately connect the transmission end or the reception end to the antenna according to a control signal. Here, by applying a control signal of 0 V or −3 V to a body of the switching device, objectives such as removing low-frequency noise may be achieved.

Meanwhile, while a signal transmitted from the transmission end to the antenna and/or a signal transmitted from the antenna to the reception end has relatively great power, a breakdown voltage of the switching device such as a transistor which is typically used in an RF switching circuit is relatively low, and thus a plurality of transistors that are serially connected are used between the transmission end and/or the reception end and the antenna. When a plurality of serially connected transistors are used, the number of resistors connected to a control terminal of each of the transistors is also increased.

In addition, when generally forming an RF switching circuit using a chip, space occupied by a transistor constituting the switching device and a resistor connected to a body terminal of the transistor in the chip, in which the RF switching circuit is implemented, is very large. For example, in the case of a single-pole-double-through (SPDT) RF switching circuit, an area occupied by a resistor connected to a body terminal of a switching device is about 8% of the entire chip area.

Since the compact size and light weight of electronic appliances become important issues, efforts have been made to reduce a chip size, but it is difficult to manufacture compact chips as long as the number of transistors and the number of resistors connected to a body of the transistor in an RF switching circuit are not reduced.

SUMMARY OF THE INVENTION

An object of the present invention is to provide a resistor-sharing switching circuit which may be formed to have a compact size by reducing the number of resistors used in a switching circuit.

According to an exemplary embodiment of the present invention, there is provided a resistor-sharing switching circuit including: a first switching device and a second switching device; and a resistor whose first end is connected to a control signal input end to which a control signal for controlling a body of the first switching device and a body of the second switching device is applied, and whose second end is connected to the bodies of the first switching device and the second switching device.

The resistor-sharing switching circuit may further include: a first switch provided between the resistor and the body of the first switching device; and a second switch provided between the resistor and the body of the second switching device.

The first switch may be turned on or turned off according to a control signal for controlling the body of the first switching device, and the second switch may be turned on or turned off according to a control signal for controlling the body of the second device.

The first switching device may be connected between a first input/output end and a second input/output end, and the second switching device may be connected between the first input/output end and a third input/output end.

The first input/output end may be an antenna, the second input/output end may be a transmission end, and the third input/output end may be a reception end.

The resistor may be at least one transistor.

According to another exemplary embodiment of the present invention, there is provided a resistor-sharing switching circuit including: a first switching device that includes at least one first transistor including a first gate, a first drain, a first source, and a first body, and turns on or turns off a connection between a first input/output end and a second input/output end; a second switching device that includes at least one second transistor including a second gate, a second drain, a second source, and a second body, and turns on or turns off a connection between the first input/output end and a third input/output end; a control signal input end to which a control signal for controlling the first body and the second body is input; and a resistor whose first end is connected to the control signal input end and whose second end is respectively connected to the first body and the second body.

DESCRIPTION OF THE PREFERRED EMBODIMENTS

Figure 1:
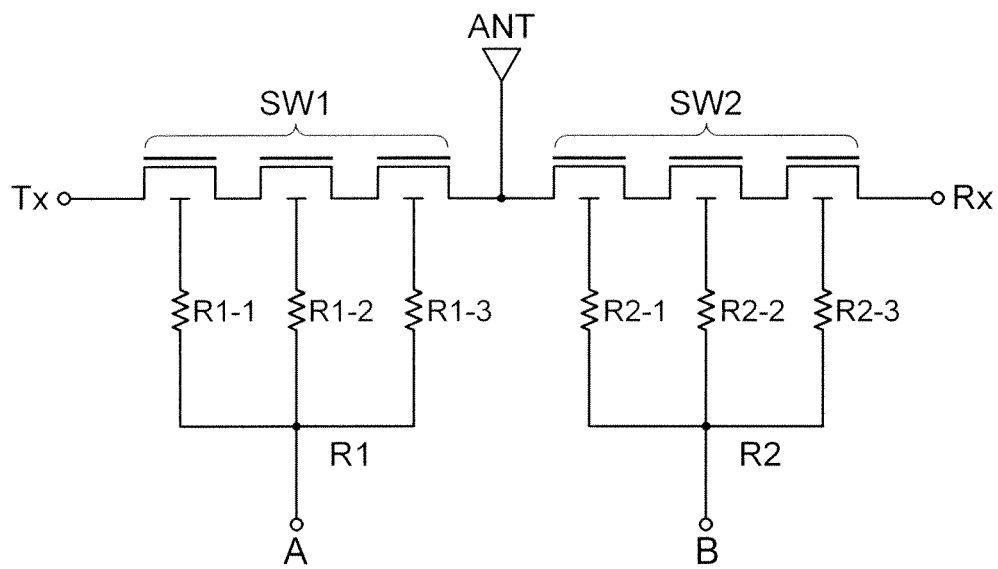
FIG. 1 is a schematic circuit diagram of a typical switching circuit according to the conventional art.

Various advantages and features of the present invention and methods accomplishing thereof will become apparent from the following description of embodiments with reference to the accompanying drawings. However, the present invention may be modified in many different forms and it should not be limited to the embodiments set forth herein. These embodiments may be provided so that this disclosure will be thorough and complete, and will fully convey the scope of the invention to those skilled in the art. Like reference numerals throughout the description denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Hereinafter, a configuration and an acting effect of exemplary embodiments of the present invention will be described in more detail with reference to the accompanying drawings.

Figure 2:
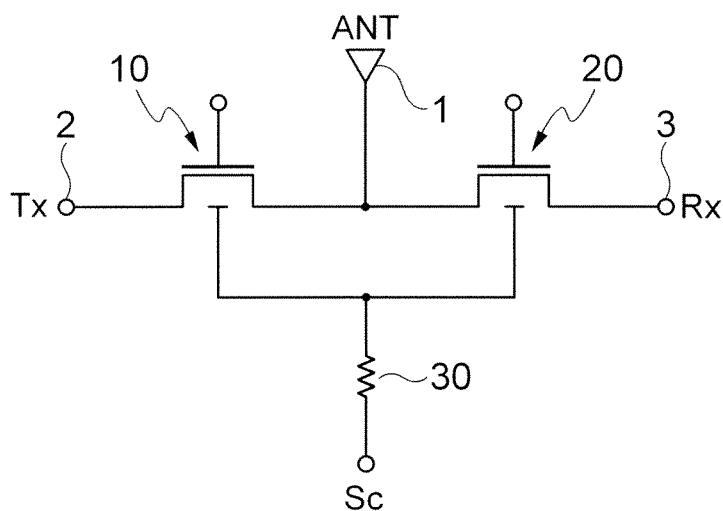
FIG. 2 is a schematic circuit diagram of a resistor-sharing switching circuit according to an embodiment of the present invention.

FIG. 2 is a schematic circuit diagram of a resistor-sharing switching circuit 100 according to an embodiment of the present invention.

Referring to FIG. 2, the resistor-sharing switching circuit 100 may include a first switching device 10, a second switching device 20, and a resistor 30.

Also, the resistor-sharing switching circuit 100 may further include a first input/output end 1, a second input/output end 2, a third input/output end 3, a resistor 30, and a control signal input end.

The first input/output end 1 and the second input/output end 2 may be connected to or blocked from each other via the first switching device 10, and the first input/output end 1 and the third input/output end 3 may be connected to or blocked from each other via the second switching device 20.

Meanwhile, the first input/output end 1 may be an antenna, the second input/output end 2 may be a transmission end, and the third input/output end 3 may be a reception end.

A first end of the resistor 30 may be connected to the control signal input end, to which a control signal for controlling bodies of the first switching device 10 and the second switching device 20 is input, and a second end of the resistor 30 may be connected to the bodies of the first switching device 10 and the second switching device 20.

Accordingly, a control signal input to the control signal input end may pass through the resistor 30 to be applied to the body of the first switching device 10 or the body of the second switching device 20, and thus, as the resistor 30 that is included to be connected to the bodies of the first switching device 10 and the second switching device 20 may be shared, the number of resistors 30 may be reduced by half compared to conventional switching circuits.

Meanwhile, when a voltage or a current to be applied to a transistor is specified, the transistor may function as a kind of resistor 30 in a circuit, and thus the resistor 30 may also be implemented as a transistor. When the resistor 30 is implemented as a transistor, the resistor 30 may be used as a kind of variable resistor by adjusting a voltage or a current applied to the transistor.

Figure 3:
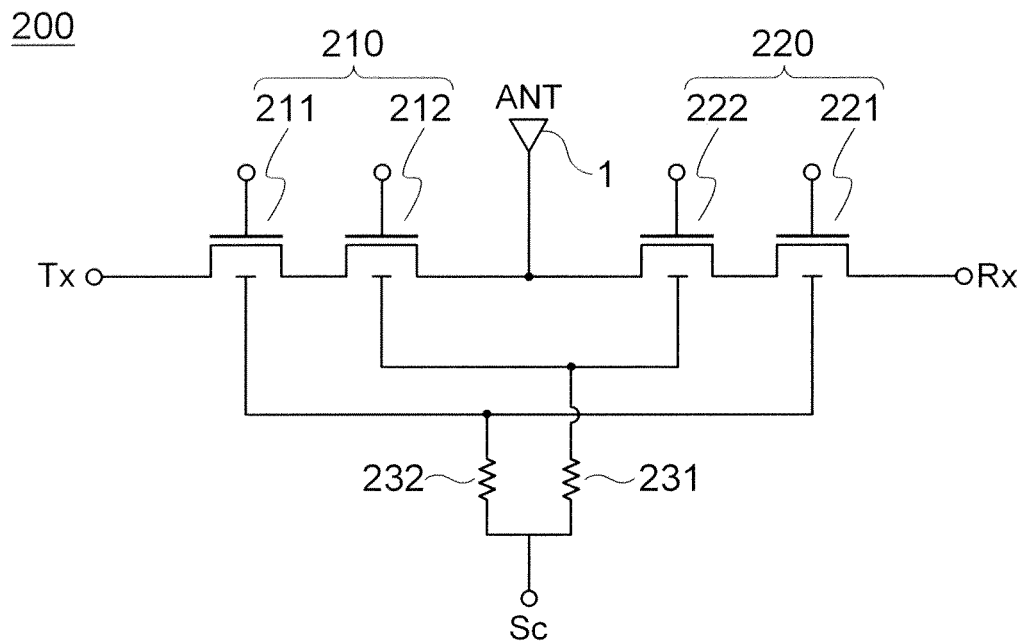
FIG. 3 is a schematic circuit diagram of a resistor-sharing switching circuit according to another embodiment of the present invention.

FIG. 3 is a schematic circuit diagram of a resistor-sharing switching circuit 200 according to another embodiment of the present invention.

Referring to FIG. 3, in the resistor-sharing switching circuit 200 according to the current embodiment of the present invention, a first switching device 210 and a second switching device 220 may each be configured of two transistors 211 and 212 and two transistors 221 and 222, respectively.

Here, a body of one of the transistors 211 and 212 of the first switching device 210 and a body of one of the transistors 221 and 222 of the second switching device 220 may share a resistor 231 or 232.

Meanwhile, while the first switching device 210 and the second switching device 220 each configured of two transistors are illustrated in FIG. 3, the number of transistors of the switching devices is not limited.

Figure 4:
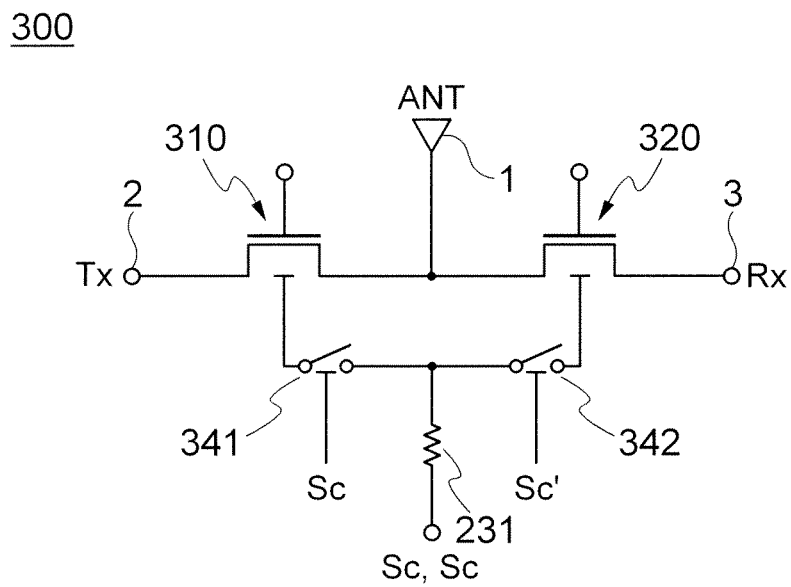
FIG. 4 is a schematic circuit diagram of a resistor-sharing switching circuit according to another embodiment of the present invention.

FIG. 4 is a schematic circuit diagram of a resistor-sharing switching circuit 300 according to another embodiment of the present invention.

Hereinafter, the resistor-sharing switching circuit 300 according to the current embodiment of the present invention will be described with reference to FIG. 4, and repeating descriptions will be omitted.

A first switch 341 may be provided between a resistor 330 and a body of a first switching device 310, and a second switch 342 may be provided between the resistor 330 and a body of a second switching device 320.

Here, the first switch 341 may be turned on/off according to a control signal Sc for controlling a first body, and the second switch 342 may be turned on/off according to a control signal Sc' for controlling a second body.

Accordingly, when the control signal Sc for controlling the first body is applied to a control signal input end, the first switch 341 may be turned on and the control signal Sc may be transferred to the first body.

Figure 5:
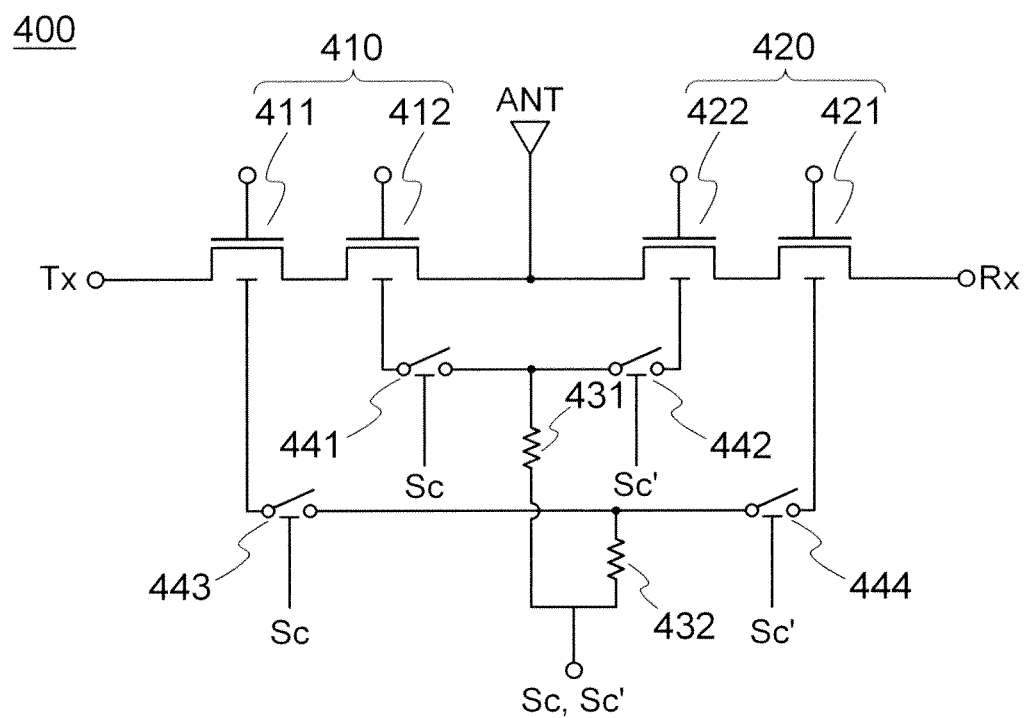
FIG. 5 is a schematic circuit diagram of a resistor-sharing switching circuit according to another embodiment of the present invention.

FIG. 5 is a schematic circuit diagram of a resistor-sharing switching circuit 400 according to another embodiment of the present invention.

Referring to FIG. 5, in the resistor-sharing switching circuit 400 according to the current embodiment of the present invention, a first switching device 410 and a second switching device 420 may each be configured of two transistors 411 and 412 and two transistors 421 and 422, respectively.

Here, a body of one of the transistors 411 and 412 of the first switching device 410 and a body of one of the transistors 441 and 422 of the second switching device 420 may share a resistor 431 or 432.

Also, a first switch 441 or 443 may be provided between a resistor 430 and a body of the transistor 411 or 412 of the first switching device 410, and a second switch 442 or 444 may be provided between the resistor 430 and a body of the transistors 421 or 422 of the second switching device 420.

Accordingly, with the resistor-sharing switching circuit according to the embodiments of the present invention, the number of resistors connected to a body terminal of a switching device may be reduced to ½ in the case of a SPDT switching circuit, to ⅓ in the case of a SP3T switching circuit, and to ¼ in the case of a SP4T switching circuit. Thus, the entire size of an RF switching circuit may be reduced by at least 5%.

With the resistor-sharing switching circuit according to the embodiments of the present invention, the number of resistors to be included in a chip is reduced by half compared to conventional switching circuits of similar performance and operation, and thus useful effects of reduction in the chip size may be provided.

The above detailed description exemplifies the present invention. Further, the above contents just illustrate and describe preferred embodiments of the present invention and the present invention can be used under various combinations, changes, and environments. That is, it will be appreciated by those skilled in the art that substitutions, modifications and changes may be made in these embodiments without departing from the principles and spirit of the general inventive concept, the scope of which is defined in the appended claims and their equivalents. Although the exemplary embodiments of the present invention have been disclosed for illustrative purposes, those skilled in the art will appreciate that various modifications, additions and substitutions are possible, without departing from the scope and spirit of the invention as disclosed in the accompanying claims. Therefore, the detailed description of the present invention does not intend to limit the present invention to the disclosed embodiments. Further, it should be appreciated that the appended claims include even another embodiment.

What is claimed is:

1. A switching circuit sharing a resistor for switching devices comprising:
    a first switching device and a second switching device;
    a resistor whose first end is connected to a control signal input end to which a control signal for controlling a body of the first switching device and a body of the second switching device is applied, and whose second end is connected to the body of the first switching device and the body of the second switching device;
    a first switch provided between the resistor and the body of the first switching device; and
    a second switch provided between the resistor and the body of the second switching device.

2. The switching circuit according to claim 1, wherein the first switch is turned on or turned off according to a control signal for controlling the body of the first switching device, and the second switch is turned on or turned off according to a control signal for controlling the body of the second switching device.

3. A switching circuit sharing a resistor for switching devices comprising:
    a first switching device that includes at least one first transistor including a first gate, a first drain, a first source, and a first body, and turns on or off a connection between a first input/output end and a second input/output end;
    a second switching device that includes at least one second transistor including a second gate, a second drain, a second source, and a second body, and turns on or off a connection between the first input/output end and third input/output end;
    a control signal input end to which a control signal for controlling the first body and the second body is input;
    a resistor whose first end is connected to the control signal input end and whose second end is respectively connected to the first body and the second body;
    a first switch provided between the resistor and the first body; and
    a second switch provided between the resistor and the second body.

4. The switching circuit according to claim 3, wherein the first switch is turned on or turned off according to a control signal for controlling the first body, and the second switch is turned on or turned off according to a control signal for controlling the second body.

* * * * *